(12) United States Patent
Black et al.

(10) Patent No.: US 7,422,440 B2
(45) Date of Patent: Sep. 9, 2008

(54) METHOD AND APPARATUS FOR DETERMINING A POSITION OF A LOCATION DEPENDENT DEVICE

(75) Inventors: William L. Black, Grandview, TX (US); Steven J. Marian, Mansfield, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 705 days.

(21) Appl. No.: 10/679,180

(22) Filed: Oct. 3, 2003

(65) Prior Publication Data

US 2005/0074991 A1   Apr. 7, 2005

(51) Int. Cl.
    *H01R 12/00* (2006.01)
(52) U.S. Cl. ........................................ 439/67
(58) Field of Classification Search ............... 439/67, 439/488, 489; 244/3.22, 3.15; 307/10.2; 324/757; 700/24, 286, 213; 340/539.13; 701/34; 342/114
    See application file for complete search history.

(56) References Cited

U.S. PATENT DOCUMENTS

| | | | |
|---|---|---|---|
| 4,378,517 A | 3/1983 | Morton et al. | |
| 4,825,133 A | 4/1989 | Tanuma et al. | |
| 4,844,380 A | 7/1989 | Peoples et al. | |
| 4,918,365 A | 4/1990 | Tanuma et al. | |
| 5,379,966 A | 1/1995 | Simeone et al. | |
| 5,435,503 A | 7/1995 | Johnson, Jr. et al. | |
| 5,444,340 A | 8/1995 | Tamaki et al. | |
| 5,455,762 A | 10/1995 | Braun | |
| 5,576,698 A * | 11/1996 | Card et al. | 340/825.52 |
| 5,659,283 A * | 8/1997 | Arratia | 337/206 |
| 5,826,819 A * | 10/1998 | Oxford | 244/3.14 |
| 5,938,148 A * | 8/1999 | Orenstein | 244/3.15 |
| 6,114,856 A * | 9/2000 | Bitts | 324/522 |
| 6,138,945 A | 10/2000 | Biggers et al. | |
| 6,160,365 A | 12/2000 | Younger et al. | |
| 6,204,801 B1 * | 3/2001 | Sharka et al. | 342/62 |
| 6,267,326 B1 * | 7/2001 | Smith et al. | 244/3.22 |
| 6,382,554 B1 * | 5/2002 | Hagelin | 244/3.15 |
| 6,441,748 B1 * | 8/2002 | Takagi et al. | 340/901 |
| 6,497,659 B1 * | 12/2002 | Rafert | 600/331 |
| 6,755,681 B2 * | 6/2004 | Chen | 439/489 |
| 6,771,167 B1 * | 8/2004 | Flick | 307/10.2 |

* cited by examiner

*Primary Examiner*—Alexander Gilman
(74) *Attorney, Agent, or Firm*—Williams, Morgan & Amerson

(57) ABSTRACT

The present invention provides an interconnect for a location dependent device. The interconnect includes at least one bus adapted to provide at least one bus signal to the location dependent device and a plurality of electrical contacts external to the location dependent device and capable of providing a signal indicative of a physical location of the location dependent device when the location dependent device is installed.

21 Claims, 5 Drawing Sheets

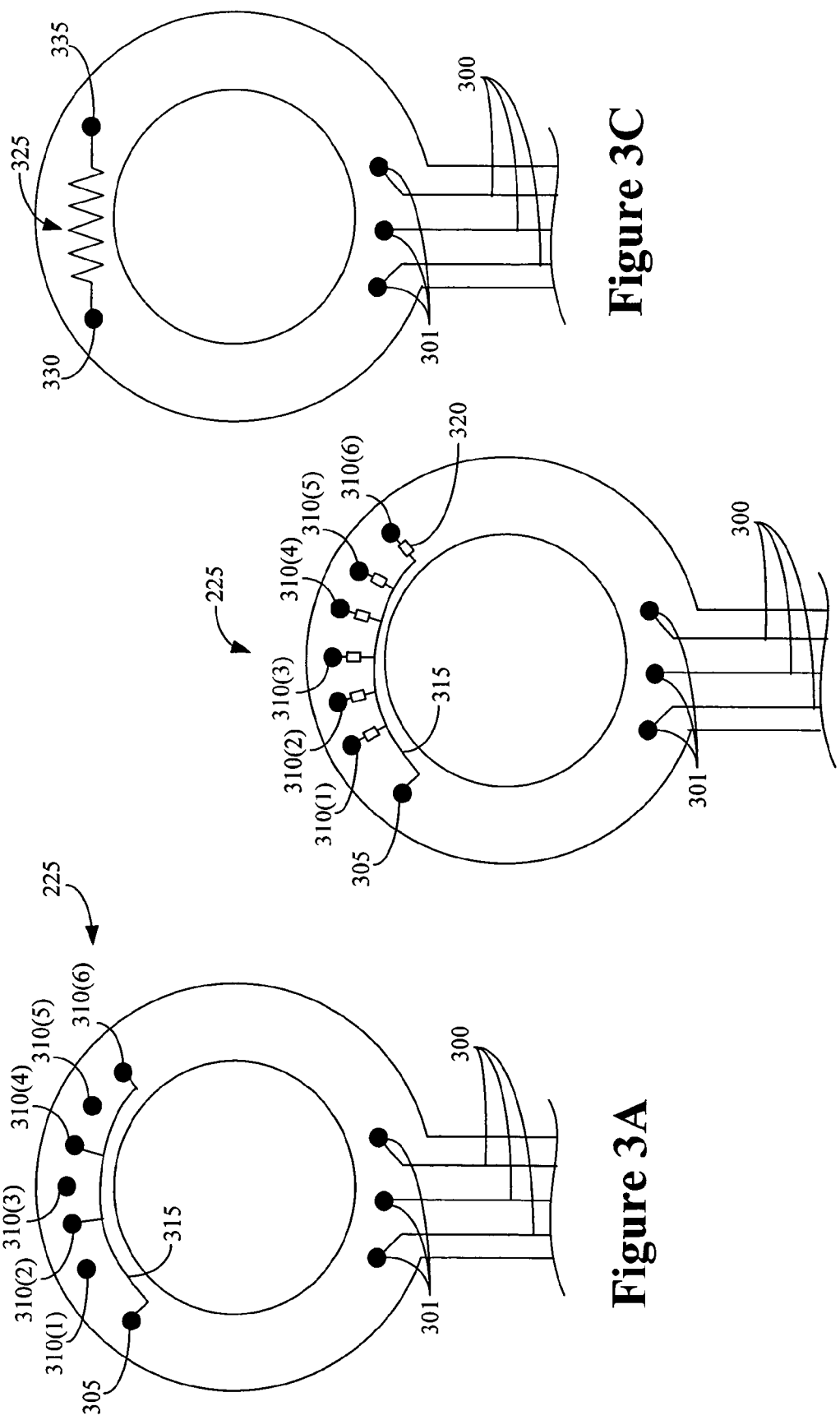

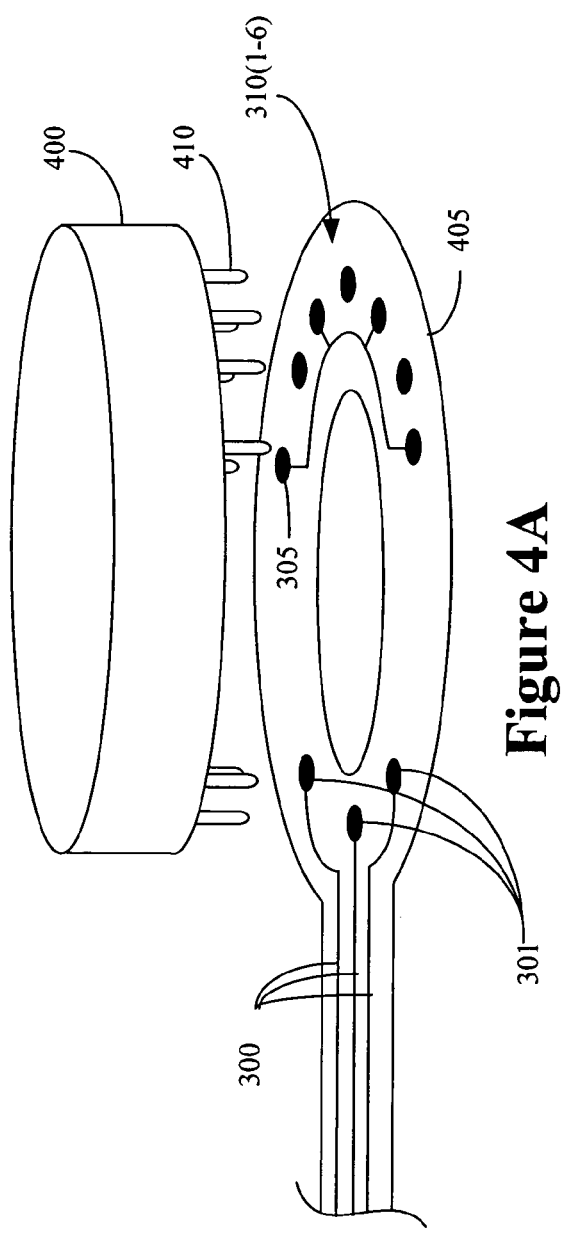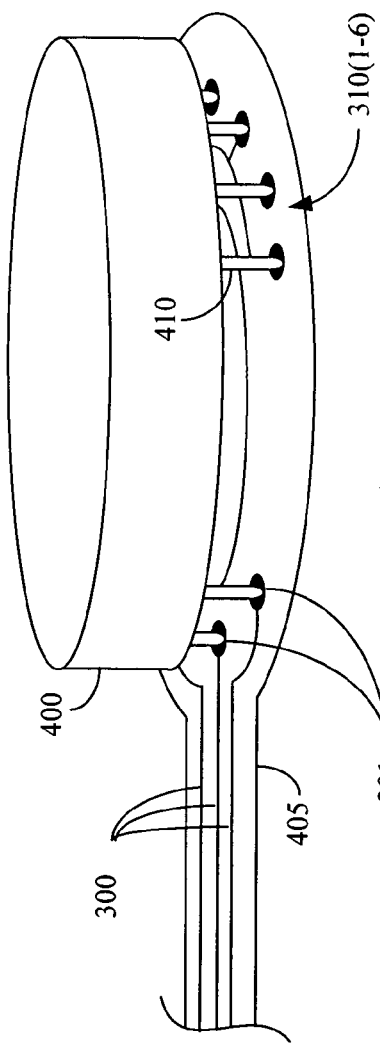

METHOD AND APPARATUS FOR DETERMINING A POSITION OF A LOCATION DEPENDENT DEVICE

CROSS REFERENCE TO RELATED APPLICATIONS

This application is related to U.S. patent application Ser. No. 10/649,074, entitled, "Method and apparatus for determining a position of an attitude control motor on a guided missile," filed Aug. 26, 2003.

BACKGROUND OF THE INVENTION

1. Field of the Invention

This invention relates generally to a location dependent device, and, more particularly, to determining a position of location dependent device.

2. Description of the Related Art

Motors and/or sensors are typically installed in various positions on a vehicle to detect location dependent events and/or perform location dependent actions. For one example, a plurality of sensors may be deployed at a corresponding plurality of positions around an automobile in order to detect impacts at one or more of the plurality of positions. The signals provided by the sensors may be used to deploy one or more air bags to protect the occupants of the automobile in the event of a collision. For another example, a plurality of attitude control motors may be deployed at a plurality of locations on a guided missile. The attitude control motors may be used to change the heading of the guided missile so that the guided missile travels in a desired direction. In one embodiment, the attitude control motors may include an explosive device, such as a pyrotechnic squib, to provide a desired impulse to the guided missile. Alternatively, the attitude control motors may include an actuator that may be used to change the orientation of a flight control surface.

One or more buses may be used to transmit signals between a controller and the motor and/or sensor. For example, the signals provided by the sensors may include an address of the sensor so that the desired air bags may be deployed to protect the occupants of the automobile in the event of a collision. For another example, the heading of the guided missile may be changed by selecting one of the attitude control motors deployed on the guided missile and transmitting a control signal to activate the selected one of the attitude control motors. The control signal includes an address signal so that only the selected attitude control motor will activate in response to the control signal.

The attitude control motors and/or sensors have their addresses programmed prior to being installed on the guided missile. However, attitude control motors and/or sensors may be installed in the wrong location, or programmed with the wrong address, which may not be visibly or electronically detectable. Therefore, it may not be possible to determine that all of the attitude control motors and/or sensors have been installed in the correct location. An incorrectly installed motor and/or sensor may not operate in the desired manner. For example, if one or more sensors are deployed at the wrong location, or programmed with the wrong address, the desired air bags may not be deployed in the event of a collision. For another example, if one or more attitude control motors are installed in the wrong location, or programmed with the wrong address, the attitude control motor may activate and steer the missile in a direction that is different from the desired direction.

SUMMARY OF THE INVENTION

In one aspect of the instant invention, an interconnect is provided for a location dependent device. The interconnect includes at least one bus adapted to provide at least one bus signal to the location dependent device and a plurality of electrical contacts external to the location dependent device and capable of providing a signal indicative of a physical location of the location dependent device when the location dependent device is installed.

In another aspect of the present invention, a system for determining a position of at least one location dependent device deployed on a vehicle is provided. The system includes at least one bus capable of transmitting at least one bus signal and a plurality of interconnects. Each of the plurality of interconnects is capable of receiving the bus signal from the bus and providing the bus signal to at least one location dependent device associated with the interconnect. The system also includes a plurality of electrical contacts, at least two of the plurality of electrical contacts being associated with each of the interconnects and being capable of providing a signal indicative of a physical location of the interconnect to the location dependent device associated with the interconnect when the location dependent device is installed.

BRIEF DESCRIPTION OF THE DRAWINGS

The invention may be understood by reference to the following description taken in conjunction with the accompanying drawings, in which like reference numerals identify like elements, and in which:

FIGS. 3A-C illustrate three alternative embodiments of a circuit that may be deployed on the flexible substrate shown in FIG. 2;

FIGS. 4A and 4B conceptually illustrate one embodiment of an attitude control motor that may be coupled to a flexible interconnect.

Figure 1:
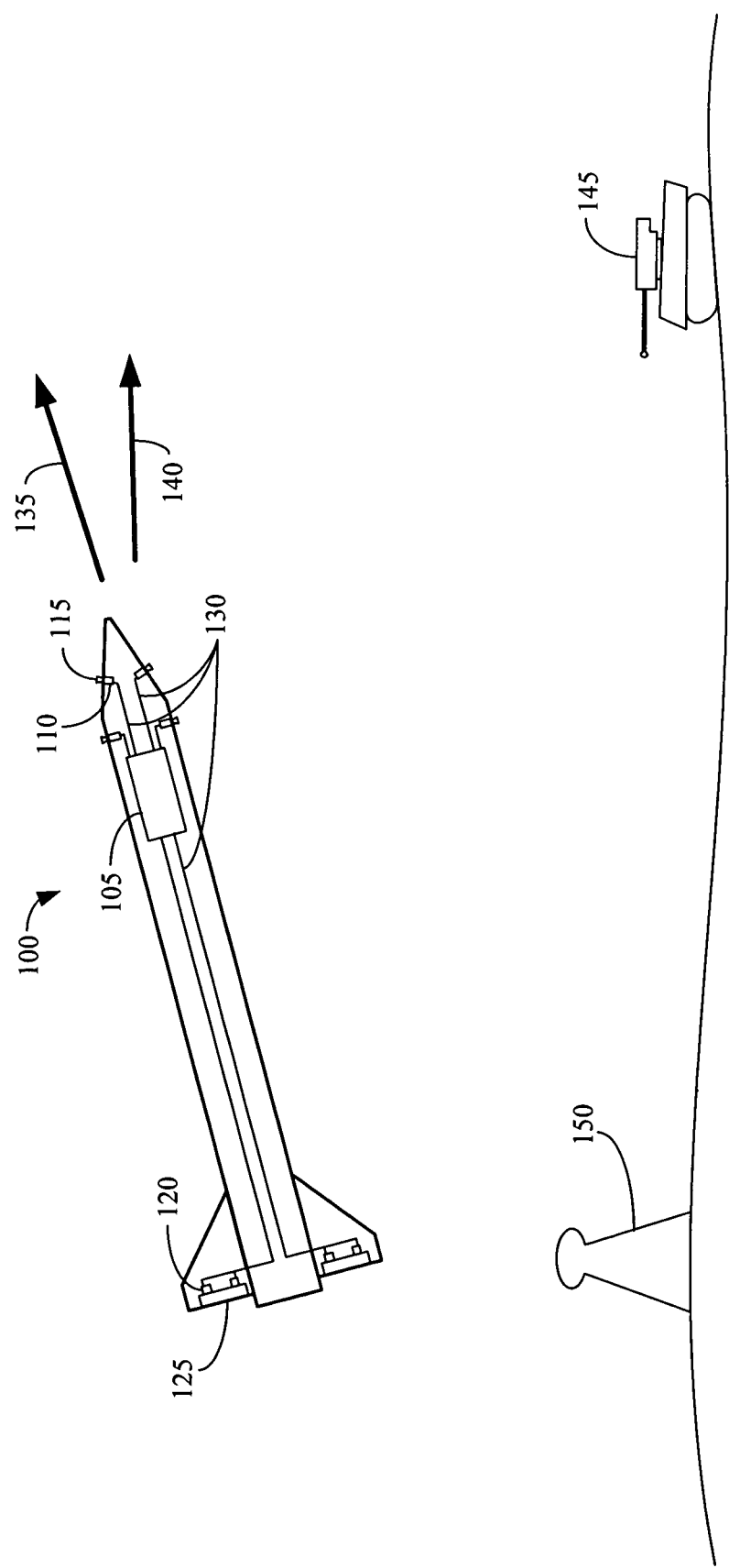
FIG. 1 shows one embodiment of a guided missile having a plurality of location-dependent attitude control motors.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 5:
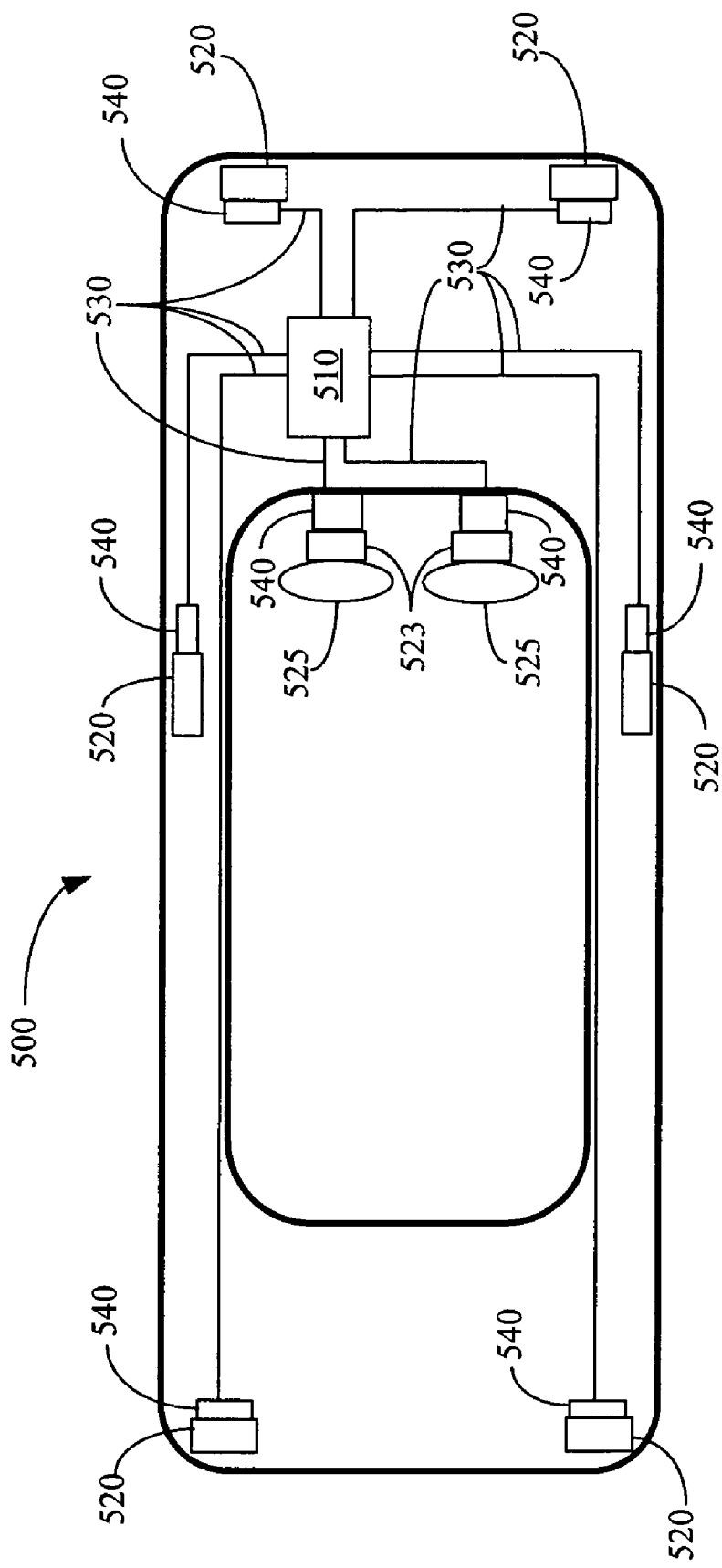
FIG. 5 conceptually illustrates a top-down view of one exemplary embodiment of an automobile having a plurality of location-dependent sensors.

An interconnect capable of providing a signal indicative of the physical location of a location-dependent device to the location-dependent device, when installed, will now be described in two exemplary contexts. First, as illustrated in FIG. 1, an interconnect for a location-dependent attitude control motor will be described in the context of a guided missile. Various embodiments of the interconnect are illustrated in FIGS. 2, 3A-C, and 4. Second, as illustrated in FIG. 5, a location-dependent sensor that may use one embodiment of the interconnect capable of providing a signal indicative of the physical location of a location-dependent sensor to the location-dependent sensor, when installed, will be described in the context of an automobile. However, it will be appreciated by those of ordinary skill in the art that the two contexts, i.e. the guided missile and the automobile, described herein are exemplary and are not intended to limit the present invention, except as set forth in the accompanying claims.

FIG. 1 shows one embodiment of a guided missile 100. A controller 105 in the guided missile 100 is coupled to a plurality of location-dependent attitude control motors 110, 115, 120, 125. In various alternative embodiments, the location-dependent attitude control motors may include a plurality of initiators 110 (only one indicated) coupled to a plurality of explosive devices 115 (only one indicated), such as pyrotechnic squibs, a plurality of actuators 120 (only one indicated) coupled to a plurality of flight control surfaces 125 (only one indicated), and the like. Although four initiators 110, four explosive devices 115, four actuators 120, and two flight control surfaces 125 are depicted in FIG. 1, the present invention is not limited to a particular number of location-dependent attitude control motors. For example, an average-size guided missile 100 may include about 150 attitude control motors. However, a larger guided missile 100 may include about 1000 or more attitude control motors, whereas a smaller guided missile 100 may have fewer attitude control motors.

The controller 105 is coupled to the location-dependent attitude control motors by one or more buses 130, which may transmit bus signals to the location-dependent attitude control motors 110, 115, 120, 125. In various alternative embodiments, the bus signal may include one or more of a control signal, a command signal, a power signal, and the like. In various alternative embodiments, the one or more buses 130 may be any desirable type of buses, including, but not limited to, a 2-wire bus and a 4-wire bus, and the one or more buses 130 may use any of a variety of standard protocols including, but not limited to, RS-232 and SDLC protocols. When installed, the plurality of attitude control motors are coupled to the buses 130 by a corresponding plurality of interconnects that are capable of providing a signal indicative of the physical location of the attitude control motors to the attitude control motors, when installed, as discussed in detail below.

Figure 2:
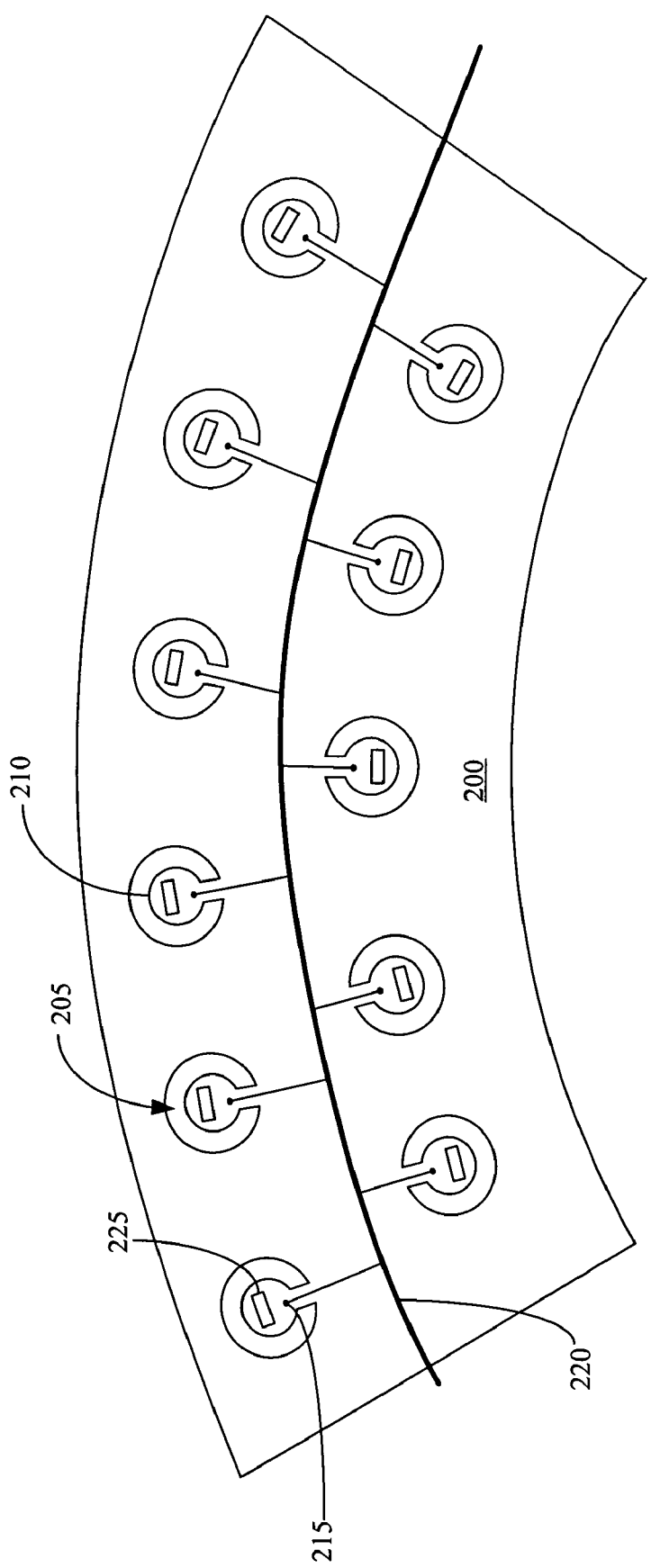
FIG. 2 illustrates one embodiment of a flexible substrate that may be deployed in the guided missile shown in FIG. 1.

FIG. 2 illustrates one embodiment of a flexible substrate 200 including a plurality of openings 205. In one embodiment, a plurality of flexible interconnects 210 are formed in the plurality of openings 205. However, the openings 205 are optional and not necessary for the practice of the present invention. For example, in alternative embodiments, the interconnects 210 may be formed on the flexible substrate 200. In one embodiment, flexible substrate 200 may be deployed interior to the guided missile 100 shown in FIG. 1. However, in alternative embodiments, the flexible substrate 200 may be deployed on the exterior of the guided missile 100, within various layers used to form the skin (not shown) of the guided missile 100, proximate one or more flight control surfaces, or at any other desirable location.

A bus 220 may be coupled to at least one electrical contact 215 formed on each of the flexible interconnects 210. In one embodiment, the bus 220 may be formed onto the flexible substrate 200. However, in alternative embodiments, the bus 220 may not be formed on the flexible substrate 200. For example, the bus 220 may be formed of wires, leads, traces, ribbon tape, or any suitable flexible substrate known in the printed circuit art that may be deployed proximate the flexible substrate 200 and may permit the bus 220 to be coupled to the at least one electrical contact 215. As discussed above, the bus 220 may provide one or more bus signals to the at least one electrical contact 215. When installed, the attitude control motors may contact the at least one electrical contact 215 and receive bus signals from the bus 220.

The flexible interconnects 210 include a circuit 225 capable of providing a signal indicative of a physical location of the attitude control motor, when the attitude control motor is installed. FIGS. 3A-C illustrate three alternative embodiments of the circuit 225. Although the present invention is not so limited, each of the alternative embodiments illustrated in FIGS. 3A-C include three leads 300 coupled to three electrical contacts 301. The three leads 300 and the three electrical contacts 301 may provide bus signals to the attitude control motor. For example, the three leads 300 and the three electrical contacts 301 may provide a control signal, a command signal, and a power signal to the attitude control motor when the attitude control motor is installed.

In the embodiment shown in FIG. 3A, the circuit 225 includes a first electrical contact 305 that may be coupled to a plurality of second electrical contacts 310(1-6). In one embodiment, the first electrical contact 305 may be coupled to the second electrical contacts 310(1-6) by a conductive trace 315 formed in the flexible interconnects 210. However, in alternative embodiments, the first electrical contact 305 may be coupled to the second electrical contacts 310(1-6) by any desirable means including, but not limited to, wires, leads, and the like. In one embodiment, the first electrical contact 305 and the plurality of the second electrical contacts 310(1-6) may be sockets adapted to receive pins. In another embodiment, the first electrical contact 305 and the plurality of the second electrical contacts 310(1-6) may be solderable contacts. Although six second electrical contacts 310(1-6) are shown in FIG. 3A, persons of ordinary skill in the art will appreciate that any desirable number of second electrical contacts 310(1-6) may be used. Moreover, additional first electrical contacts 305 may also be used in alternative embodiments.

When installed, the attitude control motor may use the first and second electrical contacts 305, 310(1-6) to determine the physical location of the attitude control motor. For example, a reference voltage may be provided to the first electrical contact 305. In one embodiment, the reference voltage may be provided to the first electrical contact 305 by the attitude control motor, when the attitude control motor is installed. However, the present invention is not limited to embodiments where in the reference voltage is provided by the installed attitude control motor. In alternative embodiments, the reference voltage may be provided by the controller 105 (shown in FIG. 1) via the bus 130, by a separate voltage source (not shown), and the like.

The first electrical contact 305 provides the reference voltage to any of the second electrical contacts 310(1-6) to which the first electrical contact 305 is electrically coupled. In the embodiment illustrated in FIG. 3A, the first electrical contact 305 is electrically coupled to second electrical contacts 310

(2), 310(4), and 310(6). Thus, when the attitude control motor is installed, the circuit 225, including the plurality of electrical contacts 305, 310(1-6), may provide a signal, i.e., a binary address 010101, indicative of the physical location of the attitude control motor.

In one embodiment, the circuit 225 may be created at the time the flexible interconnect 210 is fabricated. For example, the first electrical contacts 305 may be electrically coupled to any of the second electrical contacts 310(1-6) by forming the electrical trace 315 in the flexible interconnect 210 at the time the flexible interconnect 210 is formed. However, in alternative embodiments, a circuit 225 may be created at any desirable time. For example, in the embodiment illustrated in FIG. 3B, a plurality of fuses 320 may be formed intermediate the first electrical contact 305 and the second electrical contacts 310(1-6). The circuit 225 may then be programmed by blowing selected fuses 320 so that selected ones of the second electrical contacts 310(1-6) are electrically coupled to a first electrical contact 305.

Alternatively, the circuit 225 may include a circuit element 325 deployed intermediate the first electrical contact 330 and a second electrical contact 335, as shown in the embodiment illustrated in FIG. 3C. In various embodiments, the circuit element 325 may include a resistor, a capacitor, a voltage reference circuit, and the like. For example, the circuit element 325 may include a trace having a selected length and/or cross-section. In length and/or cross-section may be selected so that the trace provides a selected resistance between the first electrical contact 330 and the second electrical contact 335. When installed, the attitude control motor may use the first and second electrical contacts 330, 335 and the circuit element 325 to determine the physical location of the attitude control motor. For example, the attitude control motor may be capable of detecting the resistance of the circuit element 325 and using the resistance of the circuit element 325 to determine the physical location of the attitude control motor. For example, a resistance of 1Ω may indicate a first position and a resistance of 2Ω may indicate a second position.

FIGS. 4A and 4B conceptually illustrate one embodiment of an attitude control motor 400 that may be coupled to a flexible interconnect 405, such as the embodiment of the flexible interconnect 405 shown in FIG. 4A. In FIG. 4A, the attitude control motor 400 is positioned substantially above the flexible interconnect 405. The attitude control motor 400 has a plurality of pins 410 (only one indicated) that are capable of being inserted in, and thereby coupled to, the electrical contacts 310(1-6). For example, in the illustrated embodiment, the electrical contacts 310(1-6) may be sockets, as described above. In FIG. 4B, the attitude control motor 400 is installed so that the plurality of pins 410 are inserted in, and thereby coupled to, the electrical contacts 310(1-6) on the flexible interconnect 405.

Referring again to FIG. 1, in the illustrated embodiment, the guided missile 100 is traveling in a direction indicated by arrow 135. It may be desirable to change the heading of the guided missile 100 so that the guided missile 100 is traveling in a direction indicated by arrow 140. For example, it may be desirable to change the heading of the guided missile 100 so that the guided missile 100 may intercept a target 145. In one embodiment, the controller 105 may determine when it is desirable to change the heading of the guided missile 100 and may provide a signal indicative of the desired change in the heading of the guided missile 100. The provided signal may be used to activate one or more of the plurality of attitude control motors. However, in alternative embodiments, and external controller 150, such as a ground-based station, may determine when it is desirable to change the heading of the guided missile 100 and may transmit this information to the controller 105, which may then transmit a signal may be used to activate one or more of the plurality of attitude control motors. For example, the signal may include an address indicative of one or more of the attitude control motors.

Since the physical location of the attitude control motors corresponding to the address provided by the controller 105 may be determined by the installed attitude control motors using the circuit 225, it is not necessary to program the address into the attitude control motors prior to installation. Furthermore, the physical address indicated by the circuit 225 may be visibly or electronically detectable, and so it may be possible to determine that all of the circuits 225 have been programmed to correspond to the correct and physical location. Consequently, the likelihood that an incorrectly installed, or programmed, attitude control motor may operate in an undesirable manner may be reduced. For example, the likelihood that an attitude control motor may be incorrectly activated and steer the missile in a direction that is different from the desired direction may be reduced.

FIG. 5 conceptually illustrates a top-down view of one exemplary embodiment of an automobile 500. A control unit 510 in the automobile 500 is coupled to a plurality of location-dependent sensors 520 by one or more buses 530. Although the operation of the plurality of location-dependent sensors 520 will be described with reference to the illustrated exemplary embodiment of the automobile 500, persons of ordinary skill in the art will appreciate that location-dependent sensors 520, such as those described herein, may be used in a variety of contexts, and that the present invention is not limited to location-dependent sensors 520 deployed in an automobile or even in a vehicle.

In one embodiment, the location-dependent sensors 520 are capable of detecting an impact and providing a signal indicative of the physical location of the location-dependent sensors 520 to the control unit 510 via the one more buses 530 in response to detecting the impact. For example, one or more of the location-dependent sensors 520 may provide an address, such as a binary address, in response to detecting the impact. In one embodiment, the control unit 510 may use the signal indicative of the physical location of the location-dependent sensors 520 to provide a signal to one or more air bag initiators 523 in response to receiving the signal indicative of the physical location of the location-dependent sensors 520 that detected the impact. The air bag initiators 523 may inflate one or more air bags 525. Although not necessary to the practice of the present invention, the air bag initiators 523 may also be location dependent devices.

As discussed in detail above, the plurality of location-dependent sensors 520 are coupled to the one or more buses 530 by a corresponding plurality of interconnects 540. If present, the location-dependent air bag initiators 523 are also coupled to one or more buses 530 by a corresponding plurality of interconnects 540. The interconnects 540 include a circuit, such as the circuit 225 shown in FIG. 2, which is capable of providing a signal indicative of a physical location of the plurality of location-dependent sensors 520 to the plurality of location-dependent sensors 520, when installed. Therefore, the likelihood that an incorrectly installed, or programmed, location-dependent sensor 520 may operate in an undesirable manner may be reduced. For example, the likelihood that one of the location-dependent sensors 520 may provide an incorrect address indicating the physical location of an impact may be reduced and so the likelihood of deploying the wrong airbag may also be reduced.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An interconnect for a location dependent device, comprising:
   at least one bus adapted to provide at least one bus signal to the location dependent device; and
   a plurality of electrical contacts external to the location dependent device and capable of providing a signal indicative of a physical location of the location dependent device when the location dependent device is installed.

2. The interconnect of claim 1, wherein the at least one bus comprises at least one trace adapted to provide at least one of a control signal, a command signal, and a power signal to the location dependent device.

3. The interconnect of claim 1, wherein the location dependent device is at least one of a motor, an initiator, and a sensor.

4. The interconnect of claim 1, wherein the plurality of electrical contacts includes:
   a first electrical contact capable of providing a reference; and
   at least one second electrical contact electrically coupled to the first electrical contact, the second electrical contact being adapted to contact a corresponding electrical contact on the location dependent device when the location dependent device is installed.

5. The interconnect of claim 4, wherein the at least one second electrical contact is at least one of a socket and a solderable electrical contact.

6. The interconnect of claim 4, wherein the first electrical contact is adapted to contact a corresponding electrical contact on the location dependent device when the location dependent device is installed.

7. The interconnect of claim 6, wherein the first electrical contact is at least one of a socket and a solderable electrical contact.

8. The interconnect of claim 1, wherein the electrical contact includes:
   a first electrical contact capable of providing a reference; and
   at least one second electrical contact optionally electrically coupled to the first electrical contact, the at least one second electrical contact being adapted to contact a corresponding electrical contact on the location dependent device when the location dependent device is installed.

9. The interconnect of claim 8, further comprising at least one fuse deployed intermediate the first electrical contact and the at least one second electrical contact such that the at least one second electrical contact is capable of being optionally electrically coupled to the first electrical contact.

10. The interconnect of claim 1, further comprising at least one circuit element deployed intermediate the first electrical contact and the at least one second electrical contact.

11. The interconnect of claim 10, wherein the at least one circuit element comprises at least one of a resistor, a capacitor, a voltage reference circuit, and a trace having a selected resistance.

12. The interconnect of claim 11, wherein at least one of a trace length and a trace cross-section are selected to provide the selected trace resistance.

13. A system for determining a position of at least one location dependent device deployed on a vehicle, comprising:
   at least one bus capable of transmitting at least one bus signal;
   a plurality of interconnects, each being capable of receiving the bus signal from the bus and providing the bus signals to at least one location dependent device associated with the interconnect; and
   a plurality of electrical contacts, at least two of the plurality of electrical contacts being associated with each of the interconnects and being capable of providing a signal indicative of a physical location of the interconnect to the location dependent device associated with the interconnect when the location dependent device is installed.

14. The system of claim 13, wherein each of the electrical contacts associated with each of the plurality of interconnects includes:
   a first electrical contact capable of providing a reference; and
   at least one second electrical contact optionally electrically coupled to the first electrical contact, the second electrical contact being adapted to contact a corresponding electrical contact on the location dependent device when the location dependent device is installed.

15. The system of claim 13, wherein the at least one bus comprises at least one trace adapted to provide at least one of a control signal, a command signal, and a power signal to the at least one location dependent device.

16. The system of claim 13, further comprising a controller communicatively coupled to the bus and capable of providing the bus signal comprising at least one of a control signal, a command signal, and a power signal to the bus.

17. The system of claim 13, wherein the location dependent device is at least one of a location dependent sensor, a location dependent initiator, and a location dependent motor.

18. The system of claim 13, wherein the vehicle is at least one of an automobile and an airborne vehicle.

19. The system of claim 13, wherein each of the electrical contacts associated with each of the plurality of interconnects includes:
   a first electrical contact capable of providing a reference; and
   at least one second electrical contact electrically coupled to the first electrical contact, the second electrical contact being adapted to contact a corresponding electrical contact on the location dependent device when the location dependent device is installed.

20. The system of claim 19, further comprising at least one circuit element deployed intermediate the first electrical contact and the at least one second electrical contact.

21. The system of claim 20, wherein the at least one circuit element comprises at least one of a resistor, a capacitor, a voltage reference circuit, and a trace having at least one of a selected length and a selected cross section.

* * * * *